United States Patent [19]

Brown et al.

[11] Patent Number: 5,678,168

[45] Date of Patent: Oct. 14, 1997

[54] TWO-LAYER SOLDERABLE GOLD FOR THICK FILM CIRCUITS

[75] Inventors: Orville W. Brown, Landsale, Pa.; David J. Nabatian, Wayne, N.J.

[73] Assignee: National Starch and Chemical Investment Holding Corporation, Wilmington, Del.

[21] Appl. No.: 555,956

[22] Filed: Nov. 13, 1995

[51] Int. Cl.[6] .................................................. B22F 3/00
[52] U.S. Cl. .................. 428/546; 252/514; 106/1.13; 419/8
[58] Field of Search ................ 428/546; 252/514; 106/1.13; 419/8

[56] References Cited

U.S. PATENT DOCUMENTS 4,170,126  10/1979  Craven .
4,546,283  10/1985  Adamo et al. .
4,777,098  10/1988  Takamura et al. ................. 428/664

FOREIGN PATENT DOCUMENTS 2574997  12/1984  France .
3207659   3/1982  Germany .
 293575   4/1990  Germany .
59-73441  4/1984  Japan .

Primary Examiner—Charles T. Jordan
Assistant Examiner—Anthony R. Chi
Attorney, Agent, or Firm—Jane E. Gennaro

[57] ABSTRACT

A system of two thick film pastes containing gold, in which the first paste is deposited directly onto a substrate, and the second is deposited directly onto the first, contain $Cr_2O_3$ and $Bi_2O_3$, which enhance the adhesion to the substrate of the first deposited paste and the solderability of the second deposited paste.

8 Claims, No Drawings

TWO-LAYER SOLDERABLE GOLD FOR THICK FILM CIRCUITS

FIELD OF THE INVENTION

This invention is directed to conductive compositions containing gold for use in electronic circuitry.

BACKGROUND OF THE INVENTION

One method of fabricating electronic circuits consists in depositing conductive metal in a pattern of fine lines and two-dimensional areas directly onto a ceramic substrate or onto a substrate coated with dielectric. The lines act as the electrical conduits and the two-dimensional areas as bond pads for connection to outside circuitry. The conductive metal is carried in the form of a finely divided powder dispersed in an organic vehicle, the combination of powder and vehicle being known as a thick film paste. After deposition, the patterned substrate is fired to remove the organic vehicle and density the metal powder. For many applications, the conductive metal is silver, often mixed with palladium or platinum. Silver, particularly in humid environments, has a tendency to migrate on the ceramic or dielectric substrate reducing circuit reliability. In contrast, gold is inert to moisture and does not migrate; therefore, in critical applications, gold is preferred as the conductive metal.

Gold, however, does not readily accept solder, and in cases where the substrate is coated with a dielectric, the glasses in the dielectric can migrate into the gold and further detract from solderability. An additional problem exists in that gold, as other metals, does not adhere very well to dielectric or ceramic substrates. To improve adhesion, the gold is compounded with oxides and glasses, although if too much oxide and glass is added, solderability worsens. In practice, the fired gold is often burnished to enhance the acceptance of solder.

SUMMARY OF THE INVENTION

The objects of this invention are to provide conductive thick film pastes for screenprinting electronic circuitry in which the pastes contain gold and have good adhesion to substrates and good acceptance of solder.

Accordingly, this invention is a system of two conductive thick film pastes, the first paste to be deposited directly onto a substrate and the second paste to be deposited directly onto the first deposited paste. The first deposited paste contains by weight a lower level of conductive metals and a higher level of glasses and oxides relative to the second deposited paste to promote adhesion to the substrate. The second deposited paste contains a higher level of conductive powder and a lower level of glasses and oxides relative to the first deposited paste to promote acceptance of solder. In addition, it has been discovered that adhesion to the substrate can be further enhanced by the addition to the first deposited paste of about 3–4 parts $Cr_2O_3$ and, optionally, about 4–6 Parts $Bi_2O_3$ per 100 parts by weight of paste; and that acceptance of solder can be further enhanced by the addition to the second deposited paste of about 2–3.25 parts $Cr_2O_3$ and about 0.5–2 parts $Bi_2O_3$ per 100 parts by weight of paste.

The optimum performance of this system of two conductive pastes is obtained as a result of the combined effects of the two conductive pastes. Thus, good adhesion to substrate for the first deposited paste is a function not only of the composition of the first paste, but also of the second deposited paste; likewise good solder acceptance and leaching resistance for the second deposited paste are functions of the compositions of both the first and second deposited pastes.

Specifically, the first deposited paste comprises in parts by weight: (i) about 70–75 parts conductive metal powder containing gold (Au), platinum (Pt), and palladium (Pd) in the ratio of Au:Pt:Pd of 100:23–27:5–7, (ii) about 4–11 parts glasses and oxides as conventionally used in thick film pastes, excluding $Cr_2O_3$ and $Bi_2O_3$, (iii) about 3–4 parts $Cr_2O_3$, (iv) optionally about 4–6 parts $Bi_2O_3$, and (v) organic vehicle to make a total weight of 100 parts; and the second deposited paste comprises in parts by weight: (i) about: 82–87 parts conductive metal powder containing gold, platinum, and palladium in the ratio of Au:Pt:Pd of 100:15–20:0–4, (ii) about 0–4 parts glasses and oxides as conventionally used in thick film pastes, excluding $Cr_2O_3$ and $Bi_2O_3$, (iii) about 2–3.25 parts $Cr_2O_3$, (iv) about 0.5–2 parts $Bi_2O_3$, and (v) organic vehicle to make a total weight of 100 parts.

In another embodiment this invention is a method for making an electronic circuit in which gold is used as a conductive metal. The method comprises depositing onto a substrate in a predetermined circuit pattern a first layer of a conductive thick film paste comprising in parts by weight (i) about 70–75 parts conductive metal powder containing gold (Au), platinum (Pt), and palladium (Pd) in the ratio of AU:Pt:Pd of 100:23–27:5–7, (ii) about 4–11 parts glasses and oxides as conventionally used in thick film pastes, excluding $Cr_2O_3$ and $Bi_2O_3$, (iii) about 3–4 parts $Cr_2O_3$, (iv) optionally about 4–6 parts $Bi_2O_3$, and (v) organic vehicle to make a total weight of 100 parts; heating the first patterned circuit at a temperature of 800° to 900° C.; depositing over the first pattern the same pattern of a second layer of a conductive paste comprising in parts by weight: (i) about 82–87 parts conductive metal powder containing gold, platinum, and palladium in the ratio of Au:Pt:Pd of 100:15–20:0–4, (ii) about 0–4 parts glasses and oxides as conventionally used in thick film pastes, excluding $Cr_2O_3$ and $Bi_2O_3$, (iii) about 2–3.25 parts $Cr_2O_3$, (iv) about 0.5–2 parts $Bi_2O_3$, and (v) organic vehicle to make a total weight of 100 parts; and heating the second patterned circuit to 800° to 900° C.

DETAILED DESCRIPTION OF THE INVENTION

The thick film pastes are prepared by blending the conductive metallic powders, and conventionally used oxides and glasses, in combination with chromium oxide, or with chromium oxide and bismuth trioxide, into an organic vehicle and dispersing on a three-roll mill. By weight, 100 parts of the thick film paste will comprise about 83 to 96 parts of the conductive metallic powders, oxides and glasses, and about 17 to 4 parts of organic vehicle.

Representative oxides conventionally used are aluminum oxide, silicon oxide, magnesium oxide, cadmium oxide, zinc oxide, cupric oxide, and cuprous oxide. Representative glasses conventionally used are calcium borosilicate, barium borosilicate, lead borosilicate, zinc borosilicate, and combinations thereof. The glasses may also be any of those formed, for example, from silicon oxide, calcium oxide, magnesium oxide, aluminum oxide, and combinations thereof.

The organic vehicle may be any of those commonly used in the art. Typically, these will comprise by weight 1 to 40% resin, 99 to 66% solvent, and optionally 0.1 to 20% additives. The most common resin used is ethyl cellulose, which can be commercially obtained in a range of molecular weights to provide a range of viscosities. Exemplary resins that are commercially available include the N, K, and T series of ethyl celluloses available from Aqualon, a Division of Hercules, Inc., Wilmington, Del. Other commonly used resins are ethylhydroxyethyl cellulose, wood rosin, and mixtures of ethyl cellulose with acrylic resins, particularly the polymethacrylates of lower alcohols and monobutyl ether of ethylene glycol monoacetate.

The commonly used solvents are terpene alcohols, pine oil, mineral oil, and ether alcohols that boil in the range of 130° to 350° C. Exemplary solvents, used independently or in combination are diethylene glycol monobutyl ether, diethylene glycol dibutyl ether, diethylene glycol monobutyl ether acetate, dibutyl phthalate, dioctyl phthalate, dimethyl phthalate, butyl diglyme, and the like.

Dispersant and rheology control agents may be added, and are used in small quantities at about 0.05 to 2.0% of the total ink weight. Commonly used additives are triethylamine, hydrogenated caster oil, oleic acid, stearic acid, and paraffin.

The examples below disclose conductive compositions formulated in standard organic vehicles. These compositions were evaluated, according to the following Test Protocols, for adhesion, acceptance of solder (solderability), and resistance of the fired gold composition to leaching into solder.

Test Protocols

The following test protocols were used to evaluate the conductive compositions for adhesion, acceptance of solder, and amount of leaching of the fired film into solder.
Peel Adhesion.

Two layers of conductive composition are successively printed onto a ceramic substrate using a pattern of 0.080"× 0.080" pads and 0.020" wide lines, and fired to 850° C. to volatilize off the organic vehicle and densify the film. Twenty gauge tinned copper wire is soldered to the substrate by clamping the wire to the substrate and dipping the composite into flux (a rosin composition for cleaning metal) and then into molten solder for five seconds. The composite is cooled and then aged in 150° C. box furnace (by Blue M Electric Co., Blue Island, Ill.). The wire is bent 90 degrees and pulled from the substrate using a micropull instrument made by Hunter Spring, a division of Ametek, distributed by Willrich Precision Instruments, Englewood, N.J. The instrument records the amount of force needed for adhesion failure in force pounds. The adhesion failure can be between the first layer and substrate, between the layers of gold composition, or between the solder and second composition. Acceptable adhesion is 15 Newtons or greater. Adhesion lower than about 15 Newtons may result in adhesive failure in the ultimate electronic device. There is no critical upper limit to the level of adhesion; however, the strength of most commercially used substrates is about 24 Newtons, which sets an upper limit to measurement because the substrate may fracture above that level during testing.
Solder Acceptance.

Two layers of conductive composition are successively printed onto an $Al_2O_3$ substrate using a pattern of 0.080"× 0.080" pads and 0.020" wide lines, and fired to 850° C. to volatilize off the organic vehicle and densify the film. A solder paste, Alpha 229 (a product of Alpha Metals, Jersey City, N.J.) is then printed in 0.080"×0.080" pads and 0.020" lines over the gold conductive layers. The substrates are placed on a belt drier and passed through a 250° C. zone for 60 seconds. The solder melts, and in the ideal case covers all the areas on which it was printed. The percent coverage is noted visually and recorded.

Leach Resistance.

A 20 mil wide line of conductive composition is printed onto a substrate, fired at 850° C., dipped into flux, and then into molten solder for ten or twenty second intervals, until the line loses 10% of its width (1 mil on each side). The fired film dissolves in the solder, particularly on the two edges of the line where the print thickness is generally less than the center of the line. The greater the number of ten second intervals needed to remove 10% of the composition, the more leach resistant the composition.

EXAMPLES

First Deposited Gold Compositions

Examples I-IX

Conductive thick film pastes for depositing directly onto a substrate were prepared to contain a base formulation of conductive metal powders (with surface areas given in parentheses), oxides, and glass in parts by weight, and various other oxides and glasses, as reported in Table I. The components of each paste were dispersed in an organic vehicle to a total of 100 parts and blended on a three roll mill.

|  | Base formulation: |  |
|---|---|---|
| metal powders: | gold (0.24–0.36 m²/gm) | 58.00 |
|  | platinum (10–14 m²/gm) | 11.89 |
|  | palladium (12–14.5 m²/gm) | 3.00 |
| oxides: | cupric oxide (CuO) | 0.70 |
|  | zinc oxide (ZnO) | 1.20 |
|  | $Bi_2O_3$ | 5.80 |
| glasses: | bismuth/zinc/lead borosilicate | 4.00 |
|  | lead borosilicate | 2.10 |

The organic vehicle comprised by weight 13% ethyl cellulose (a product of Aqualon Co., Wilmington, Del.), 43% of terpineol (a blend of tertiary terpene alcohols, a product of Hercules, Corp., Wilmington Del.), and 44% butyl diglyme (diethylene glycol dibutyl ethers, a product of Ferro Corp., Baton Rouge, La.).

In addition, each of the pastes contained by weight 0.10 part amine surfactant (triethanolamine, a product of Fisher Scientific, Fair Lawn, N.J.), 1.0 part antisettling agent (MPA-60MS, a product of Rheox, Hightstown, N.J.), and 0.13 part lecithin (a wetting agent and product of Fisher Scientific, Fair Lawn, N.J.).

The base formulation is exemplary of commercial preparations, and was used as a control. The paste of later described Example XVII was used as the second layer. The two layer system was tested for adhesion of the first deposited layer and solderability of the second deposited layer according to the above described Test Protocols. The results are reported in Table I.

TABLE I

|  | Adhesion | | |
|---|---|---|---|
|  | lbs. | (Newtons) | Solderability |
| Base formulation A | 2.0 | (8.9) | ~70% |
| Base Formulation B |  |  |  |
| CdO used instead of ZnO Example I | same results as base formulation A | | |
| CoO    3.00 parts | 0 |  | ~40% |

TABLE I-continued

|  | Adhesion | | |
|---|---|---|---|
|  | lbs. | (Newtons) | Solderability |
| Example II | | | |
| calcium borosilicate 3.00 parts | 2.2 | (9.79) | ~40% |
| Example III | | | |
| barium borosilicate 3.00 parts | 0.6 | (2.67) | ~70% |
| Example IV | | | |
| lead borosilicate 1.90* parts *this amount is in addition to what is present in base formulation | 2.2 | (9.79) | ~70% |
| Example V | | | |
| $Cr_2O_3$   4.00 parts | 3.75 | (16.69) | ~95% |
| Example VI | | | |
| CdO   3.80* parts $Cr_2O_3$   3.00 parts *bismuth trioxide eliminated and cadmium oxide added | 3.89 | (17.31) | ~90% |
| Example VII | | | |
| $Cr_2O_3$   4.00 parts lead borosilicate 3.00* parts *this additional glass added and bismuth/zinc/lead borosilicate glass reduced from 4 parts to 3 parts $Bi_2O_3$ also reduced from 5.80 parts to 4.80 parts | 3.4 | (15.13) | ~80% |
| Example VIII | | | |
| $Cr_2O_3$   3.00 parts $Bi_2O_3$ also reduced from 5.80 parts to 4.80 parts | 5.48 | (24.39) | 100% |
| Example IX* | | | |
| $Cr_2O_3$   3.00 parts *this is same as Example VIII except that different lots of the ingredients were used $Bi_2O_3$ also reduced from 5.80 parts to 4.80 parts | 5 | (22.25) | 100% |

Base Formulation B and Example I demonstrate that the addition of cadmium oxide or cobalt oxide gives no improvement to adhesion or solderability. Examples II, III, and IV demonstrate that the addition of calcium, barium, or lead borosilicate glass gives no improvement to adhesion. (Solderability was not expected to improve in the presence of higher levels of glasses.)

Example V demonstrates that the addition of chromium oxide improves solderability of the second layer and adhesion of the first layer. Example VI demonstrates that the improvement to adhesion is the effect of the chromium oxide and not of bismuth trioxide, and that chromium oxide is effective at 3–4 parts per hundred parts of the paste. A comparison between Examples V and VI also shows that bismuth trioxide has a slight positive effect on solder acceptance of the second layer.

Example VII shows that higher levels of glass reduce solder acceptance, as would be expected, even though bismuth trioxide was reintroduced.

Examples VIII and IX, in combination with Example V, show the working ranges for the combination of bismuth trioxide and chromium oxide that provide the most improved adhesion and solderability relative to the base formulations.

The Examples also demonstrate the balance and interaction between the two layers. Although the composition of the second deposited layer remained constant, the solderability of that layer varied as a function of the composition of the first layer.

Second Deposited Gold Compositions

Conductive thick film pastes to be deposited over previously deposited conductive pastes were prepared to contain a base formulation of conductive metal powders (with surface areas given in parentheses), oxides, and additives in parts by weight, and various other oxides and glasses, as reported in Table II. The components of each paste were dispersed in an organic vehicle to a total of 100 parts and blended on a three roll mill. The organic vehicle and additives were the same as used for Examples I–IX (except that no lecithin was used in the vehicle). All of the examples were prepared without glass in order to enhance acceptance of solder.

The base formulation for Examples X and XI contained the following conductive metal powders (with surface areas given in parentheses) in parts by weight:

| gold powder (0.24–0.36 $m^2$/gm) | 70.60 |
|---|---|
| platinum powder (10–14 $m^2$/gm) | 12.00 |
| palladium powder (12–14.5 $m^2$/gm) | 1.80 |

The base formulation for Examples XII–XIX contained the following conductive metal powders (with surface areas given in parentheses) in parts by weight:

| gold powder (0.24–0.36 $m^2$/gm) | 69.80 |
|---|---|
| platinum powder (3–5.8$^2$/gm) | 11.80 |
| palladium powder 3.5–7.0$^2$/gm | 1.60 |

The paste of Example VIII was used for the first layer under the formulations of Examples X through IX. The two layer systems were tested for adhesion of the first deposited layer, and solderability and leach resistance of the second deposited layer as described above in the Test Protocols. The results are reported in Table II.

TABLE II

| Resistance | Adhesion | | | |
|---|---|---|---|---|
|  | lbs. | (Newtons) | Solderability | Leach |
| Example X | | | | |
| $Cr_2O_3$   2.04 parts | 2.4 | (10.68) | ~85% | 2 × 10 sec. |
| Example XI | | | | |
| $Bi_2O_3$   2.04 parts | 2.7 | (12.01) | ~90% | 2 × 10 sec. |
| Example XII | | | | |
| $Cr_2O_3$   3.24 parts | 2.6 | (11.57) | ~80% | 2 × 10 |
| Example XIII | | | | |
| $Cr_2O_3$   3.24 parts $TiO_2$   0.80 parts | 1.45 | (6.45) | ~80% | 3 × 10 |
| Example XIV | | | | |
| $Cr_2O_3$   3.24 parts CdO   0.80 parts | 1.8 | (8.01) | ~90% | 3 × 10 |
| Example XV | | | | |
| $Cr_2O_3$   3.24 parts | 0 |  | 70% | 2 × 10 |

TABLE II-continued

| Resistance | | Adhesion | | Solderability | Leach |
|---|---|---|---|---|---|
| | | lbs. | (Newtons) | | |
| $Cu_2O$ | 0.80 parts | | | | |
| Example XVI | | | | | |
| $Cr_2O_3$ | 3.24 parts | 3.5 | (15.57) | ~95% | 5 × 20 |
| $Bi_2O_3$ | 0.80 parts | | | | |
| Example XVII | | | | | |
| $Cr_2O_3$ | 2.24 parts | 5.47 | (24.34) | 100% | 5 × 20 |
| $Bi_2O_3$ | 1.58 parts | | | | |
| Example XVIII | | | | | |
| $Bi_2O_3$ | 0.80 parts | 0 | | ~40 | 2 × 10 |
| NiO | 3.24 parts | | | | |
| Example XIX | | | | | |
| $Bi_2O_3$ | 0.80 parts | 1.3 | (5.78) | ~40% | 2 × 10 |
| CoO | 3.25 parts | | | | |

The results show that the best performance for solderability and leaching resistance of the second layer is obtained by a combination of the chromium oxide and bismuth trioxide in Examples XVI and XVII. Examples XII through XV show that the chromium oxide performs best with the bismuth trioxide, and Examples XVI, XVIII, and XIX show that the bismuth trioxide performs best with the chromium oxide. The Examples also show that although the composition of the first deposited layer remained constant, the adhesion of the first layer varied as a function of the composition of the second layer.

We claim:

1. A system of two conductive thick film pastes, the first paste to be deposited directly onto a substrate and the second paste to be deposited directly onto the first deposited paste, in which the first deposited paste comprises in parts by weight:
   (i) 70–75 parts conductive metal powder containing gold (Au), platinum (Pt), and palladium (Pd) in the ratio of Au:Pt:Pd of 100:23–27:5–7,
   (ii) 4–11 parts glasses and oxides as conventionally used in thick film pastes, excluding $Cr_2O_3$ and $Bi_2O_3$,
   (iii) 3–4 parts $Cr_2O_3$,
   (iv) optionally 4–6 parts $Bi_2O_3$, and
   (v) organic vehicle to make a total weight of 100 parts;
and in which the second deposited paste comprises in parts by weight:
   (i) 82–87 parts conductive metal powder containing gold, platinum, and palladium in the ratio of Au:Pt:Pd of 100:15–20:0–4,
   (ii) 0–4 parts glasses and oxides as conventionally used in thick film pastes, excluding $Cr_2O_3$ and $Bi_2O_3$,
   (iii) 2–3.25 parts $Cr_2O_3$,
   (iv) 0.5–2 parts $Bi_2O_3$, and
   (v) organic vehicle to make a total weight of 100 parts.

2. The system of thick film pastes according to claim 1 in which the oxides and glasses in (ii) are selected from the group consisting of aluminum oxide, silicon oxide, magnesium oxide, cadmium oxide, zinc oxide, cupric oxide, cuprous oxide, calcium borosilicate, barium borosilicate, lead borosilicate, zinc borosilicate, and glasses formed from silicon oxide, calcium oxide, magnesium oxide, aluminum oxide, and combinations thereof.

3. The system of thick film pastes according to claim 1 in which the vehicle comprises by weight 1 to 40% ethyl cellulose or ethylhydroxyethyl cellulose resin, and 99 to 66% solvent, the solvent being a terpene alcohol, pine oil, mineral oil, or ether alcohol that boils in the range of 130° to 350° C.

4. The system of thick film pastes according to claim 3 in which the solvent is selected from the group consisting of diethylene glycol monobutyl ether, diethylene glycol dibutyl ether, diethylene glycol monobutyl ether acetate, dibutyl phthalate, dioctyl phthalate, dimethyl phthalate, butyl diglyme, and combinations thereof.

5. A method for making a circuit in which gold is used as a conductive metal that comprises
   (A) depositing onto a substrate in a predetermined circuit pattern a first layer of a conductive thick film paste, the thick film paste comprising in parts by weight
      (i) 70–75 parts conductive metal powder containing gold (Au), platinum (Pt), and palladium (Pd) in the ratio of Au:Pt:Pd of 100:23–27:5–7,
      (ii) 4–11 parts glasses and oxides as conventionally used in thick film pastes, excluding $Cr_2O_3$ and $Bi_2O_3$,
      (iii) 3–4 parts $Cr_2O_3$,
      (iv) optionally 4–6 parts $Bi_2O_3$, and
      (v) organic vehicle to make a total weight of 100 parts;
   (B) heating the first patterned circuit at a temperature of 800° to 900° C.;
   (C) depositing over the first conductive thick film paste the same pattern of a second conductive thick film paste, the thick film paste comprising in parts by weight:
      (i) 82–87 parts conductive metal powder containing gold, platinum, and palladium in the ratio of Au:Pt:Pd of 100:15–20:0–4,
      (ii) 0–4 parts glasses and oxides as conventionally used in thick film pastes, excluding $Cr_2O_3$ and $Bi_2O_3$,
      (iii) 2–3.25 parts $Cr_2O_3$,
      (iv) 0.5–2 parts $Bi_2O_3$, and
      (v) organic vehicle to make a total weight of 100 parts; and
   (D) heating the second patterned circuit to 800° to 900° C.

6. The method according to claim 5 in which the oxides and glasses in (ii) are selected from the group consisting of aluminum oxide, silicon oxide, magnesium oxide, cadmium oxide, zinc oxide, cupric oxide, cuprous oxide, calcium borosilicate, barium borosilicate, lead borosilicate, zinc borosilicate, and glasses formed from silicon oxide, calcium oxide, magnesium oxide, aluminum oxide, and combinations thereof.

7. The method according to claim 5 in which the vehicle comprises by weight 1 to 40% ethyl cellulose or ethylhydroxyethyl cellulose resin, and 99 to 66% solvent, the solvent being a terpene alcohol, pine oil, mineral oil, or ether alcohol that boils in the range of 130° to 350° C.

8. The method according to claim 7 in which the solvent is selected from the group consisting of diethylene glycol monobutyl ether, diethylene glycol dibutyl ether, diethylene glycol monobutyl ether acetate, dibutyl phthalate, dioctyl phthalate, dimethyl phthalate, butyl diglyme, and combinations thereof.

* * * * *